(12) United States Patent
Liu et al.

(10) Patent No.: US 8,921,229 B2
(45) Date of Patent: Dec. 30, 2014

(54) METHOD OF POLISHING COPPER WIRING SURFACES IN ULTRA LARGE SCALE INTEGRATED CIRCUITS

(76) Inventors: Yuling Liu, Tianjin (CN); Xiaoyan Liu, Tianjin (CN); Jun Tian, Tianjin (CN)

(*) Notice: Subject to any disclaimer, the term of this patent is extended or adjusted under 35 U.S.C. 154(b) by 0 days.

(21) Appl. No.: 13/592,326

(22) Filed: Aug. 22, 2012

(65) Prior Publication Data

US 2012/0315764 A1 Dec. 13, 2012

Related U.S. Application Data

(63) Continuation-in-part of application No. PCT/CN2010/080468, filed on Dec. 30, 2010.

(30) Foreign Application Priority Data

Jul. 21, 2010 (CN) .......................... 2010 1 0231553

(51) Int. Cl.
| | | |
|---|---|---|
| *H01L 21/461* | (2006.01) | |
| *C09K 3/14* | (2006.01) | |
| *C09G 1/02* | (2006.01) | |
| *H01L 21/321* | (2006.01) | |

(52) U.S. Cl.
CPC .......... *H01L 21/3212* (2013.01); *C09K 3/1463* (2013.01); *C09G 1/02* (2013.01)
USPC ............... 438/692; 216/37; 216/67; 438/645; 438/693

(58) Field of Classification Search
USPC ....................... 216/37, 67; 438/645, 692, 693
See application file for complete search history.

(56) References Cited

U.S. PATENT DOCUMENTS

| 3,556,883 A * | 1/1971 | Naito et al. ..................... 16/107 |
|---|---|---|
| 2005/0208761 A1 * | 9/2005 | Oh et al. ....................... 438/645 |
| 2008/0064211 A1 * | 3/2008 | Tsugita et al. ................ 438/691 |

FOREIGN PATENT DOCUMENTS

CN        1861723       * 11/2006

* cited by examiner

*Primary Examiner* — Nadine Norton
*Assistant Examiner* — Maki Angadi
(74) *Attorney, Agent, or Firm* — Matthias Scholl P.C.; Matthias Scholl

(57) ABSTRACT

A method of polishing copper wiring surfaces of in ultra large scale integrated circuit, the method including: a) preparing a polishing solution including between 35 and 80 w. % of a nano $SiO_2$ abrasive, between 12 and 60 w. % of deionized water, between 1 and 3 w. % of an oxidant, between 1 and 4 w. % of an active agent, and between 0.5 and 1.5 w. % of a chelating agent; and b) polishing using the polishing solution under following conditions: between 2 and 5 kPa pressure; between 20 and 50° C.; between 120 and 250 mL/min slurry flow rate; and at between 30 and 60 rpm/min rotational speed.

7 Claims, No Drawings

METHOD OF POLISHING COPPER WIRING SURFACES IN ULTRA LARGE SCALE INTEGRATED CIRCUITS

CROSS-REFERENCE TO RELATED APPLICATIONS

This application is a continuation-in-part of International Patent Application No. PCT/CN2010/080468 with an international filing date of Dec. 30, 2010, designating the United States, now pending, and further claims priority benefits to Chinese Patent Application No. 201010231553.X filed Jul. 21, 2010. The contents of all of the aforementioned applications, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 14781 Memorial Drive, Suite 1319, Houston, Tex. 77079.

BACKGROUND OF THE INVENTION

1. Field of the Invention

The invention relates to a method of polishing copper surfaces, and more particularly to a method of polishing surfaces of copper wiring in an ultra large scale integrated circuit.

2. Descriptions of Related Art

Copper has low resistivity, superb anti-electromigration, and low thermal sensitivity, and can produce a shorter resistance and capacitance delay (RC delay) and improve the reliability of circuits. Thus, copper wire is an ideal substitute for aluminum wire to work as interconnection lines.

As the size of elements of integrated circuits becomes smaller, and the number of metal layers and the diameter of the silicon substrate increase, the degree of the flattening of each layer has become one of the important factors that affect the linewidth of the etching of the integrated circuits, and been a bottle-neck in the development of microelectronics. Chemico-mechanical polishing (CMP) is so far the most advanced technology for providing a whole flattening for a plurality of layers of copper wirings, dielectrics, and barriers. A model of polishing rate of the conventional CMP is MRP=Kpv, from which it is known that the polishing rate is proportional to the press (p) and the rotational speed (v). However, the conventional CMP method has large press, and after polishing, scratches, edge collapses, and roughness easily occur on the surface, all of which result in low yields. In the meanwhile, with the development of the integrated circuit technology, new materials with small permittivity are necessary to work as a dielectric layer to shorten the RC delay, and to reduce the power loss. However, such materials are always porous materials, the larger the porosity is, the smaller the permittivity is, and the worse the compression resistance is, thereby resulting in cracks when bearing high mechanical strengths. Porous materials with permittivity of 2.5 are widely used in 45 nm technology node, in which the magnitude of the mechanical strength directly affects the performance of the CMP method. To lower the down force, electric and chemico-mechanical polishing (ECMP) method has been proposed, which, however, has such disadvantages as unrepeatable production, poor stability, and high production cost and so on. If the conventional CMP method is applicable to smaller technology nodes, customers prefer CMP method to ECMP method, as far as the cost and risk are concerned.

Therefore, to achieve an effective polishing rate under low pressure, and at the same time to solve problems such as scratches, edge collapses, and damages on material have been critical in the development of the CMP technology.

SUMMARY OF THE INVENTION

In view of the above-described problems, it is one objective of the invention to provide a method of polishing surfaces of copper wiring in an ultra large scale integrated circuit.

To achieve the above objective, in accordance with one embodiment of the invention, there is provided a method of polishing surfaces of copper wiring of an ultra large scale integrated circuit, the method comprising:

a) preparing a polishing solution comprising between 35 and 80 w. % of a nano $SiO_2$ abrasive, between 12 and 60 w. % of deionized water, between 1 and 3 w. % of an oxidant, between 1 and 4 w. % of an active agent, and between 0.5 and 1.5 w. % of a chelating agent; and b) polishing using the polishing solution under following conditions: pressure: between 2 and 5 kPa; temperature: between 20 and 50° C.; flow rate: between 120 and 250 mL/min; and rotational speed: between 30 and 60 rpm/min In a class of this embodiment, the nano $SiO_2$ abrasive is an alkaline water-soluble silica sol having a concentration of between 4 and 50 w. %, a particle size of between 15 and 40 nm, and a pH value of between 9 and 13.

In a class of this embodiment, the chelating agent is an FA/OII chelating agent: ethylene diamine tetra-acetic acid tetra (tetra-hydroxyethyl ethylene diamine).

In a class of this embodiment, the active agent is selected from the group consisting of an FA/O surfactant, $O_\pi\text{-}7((C_{10}H_{21}\text{—}C_6H_4\text{—}O\text{—}CH_2CH_2O)_7\text{—}H)$, $O_\pi\text{-}10$ $((C_{10}H_{21}\text{—}C_6H_4\text{—}O\text{—}CH_2CH_2O)_{10}\text{—}H)$, $O\text{–}20$ $(C_{12\text{-}18}H_{25\text{-}37}\text{—}C_6H_4\text{—}O\text{—}CH_2CH_2O)_{70}\text{—}H)$, or JFC.

In a class of this embodiment, the oxidant is a soluble oxidant under alkaline conditions and selected from the group consisting of $H_2O_2$, $KClO_3$, $KMnO_4$, or $KNO_3$.

Effects of the invention are summarized below: the oxidant in the polishing solution oxidizes the copper, while the FA/OII chelating agent having potent chelating ability quickly reacts with the oxidized copper to yield a soluble chelate that quickly separates from the copper surface. Thus, methods for removing copper on the surface mainly dependent on mechanical frictions is avoided, and copper polishing under low mechanical strength is realized. The removal of the resulting chelate is accomplished by breaking molecular bonds, which has little damage on the surface of materials, and reaction products are removed from the surface under low pressure, comparing with the conventional mechanical removal methods which result in damages of crystal structures of the copper surface, the method of the invention improves the quality of the copper surface. In the meanwhile, the chemical action of the CMP process is scientifically improved under low pressure, thereby compromising the impact of mechanical action on the polishing rate, and achieving high polishing effect.

Advantages of the invention are summarized below:

(1) the low pressure in the polishing process can solve the problems of scratches, edge collapses, roughness, and others;

(2) the FA/OII chelating agent having potent chelating ability quickly reacts with the oxidized copper to yield a soluble chelate that quickly separates from the copper surface, thus, methods for removing copper on the surface mainly dependent on mechanical frictions have been avoided, and copper polishing under low mechanical strength has been realized. The removal of the resulting chelate is accomplished by breaking molecular bonds, which has little damage on the surface of materials, and improves the polishing rate under low pressure;

(3) the abrasive of the polishing solution is nano $SiO_2$ sol having a small particle size (15-40 mm), high concentration (>40 w. %), low hardness (little damage to substrates), and high degree of dispersion, all of which lead to a polishing with high speed, high degree of flattening, and little pollution, and at the same time solve problems such as scratches, easy deposition, and others, caused by high hardness of $Al_2O_3$ abrasive;

(4) the alkaline polishing solution is not corrosive to devices, and the silica sol has good stability, thus disadvantages of the acid polishing solution of heavy pollution, easy gel formation, and others can be solved. Due to the amphoteric property of substrate materials, soluble compounds are easy to form and to be removed when the pH value is above 9.

(5) the FA/O surfactant can make adsorbates in a state of physical adsorption, thus the adsorbates are easy to be removed to assure the cleanness of the surface.

In summary, the method of the invention has simple operation, non-additional device, low cost, high efficiency, pollution free, and significant improvement in device performance and yields.

DETAILED DESCRIPTION OF THE EMBODIMENTS

To further illustrate the invention, experiments detailing a method of polishing surfaces of copper wiring of an ultra large scale integrated circuit are described below. It should be noted that the following examples are intended to describe and not to limit the invention.

Example 1

Preparation of a polishing solution and conditions for polishing copper wiring using a low pressure CMP method are as follows:

Preparation of 3135 g of a copper wiring polishing solution: 1200 g of a nano silica sol (15-20 nm) with a concentration of between 4 and 50 w. % was stirred with 1800 g of deionized water added to yield a mixture, and thereafter, the stirring was continued with 15 g of a FA/OII chelating agent, 30 g of a FA/O surfactant, and 90 g of an oxidant added to the mixture. The pH value of the mixture was adjusted to between 9 and 13, and the resulting solution was stirred evenly to yield 3135 g of the copper wiring polishing solution.

The FA/OII chelating agent was ethylene diamine tetra-acetic acid tetra (tetra-hydroxyethyl ethylene diamine).

The active agent was selected from the group consisting of FA/O surfactant, $O_\pi$-7(($C_{10}H_{21}$—$C_6H_4$—O—$CH_2CH_2O)_7$—H), $O_\pi$-10 (($C_{10}H_{21}$—$C_6H_4$—O—$CH_2CH_2O)_{10}$—H), O-20 ($C_{12-18}H_{25-37}$—$C_6H_4$—O—$CH_2CH_2O)_{70}$—H), or JFC.

The oxidant was a soluble oxidant under alkaline conditions selected from the group consisting of $H_2O_2$, $KClO_3$, $KMnO_4$, or $KNO_3$.

The nano $SiO_2$ abrasive, the active agent, and the FA/OII chelating agent were all supplied by Tianjin Jingling Microelectronics Materials Co., Ltd.

Polishing was processed under following conditions: 5 kPa of a pressure, 250 mL/min of a flow rate, and 30 rpm/min of a rotational speed at 20° C. for 10 min.

Polishing rate was 972 nm/min, ununiformity of the polishing rate was controlled at 0.05, no scratches on the surface, and the roughness was 0.8 nm.

Example 2

Preparation of a polishing solution and conditions for polishing copper wiring using a low pressure CMP method are as follows:

Preparation of 3240 g of a copper wiring polishing solution: 2000 g of a nano silica sol (20-30 nm) with a concentration of between 4 and 50 w. % was stirred with 1000 g of deionized water added to yield a mixture, and thereafter, the stirring was continued with 90 g of a FA/OII chelating agent, 120 g of a FA/O surfactant, and 30 g of an oxidant added to the mixture. The pH value of the mixture was adjusted to between 9 and 13, and the resulting solution was stirred evenly to yield 3240 g of the copper wiring polishing solution.

Polishing was processed under following conditions: 2 kPa of a pressure, 120 mL/min of a flow, and 60 rpm/min of a rotational speed at 50° C. for 10 min.

Polishing rate was 863 nm/min, ununiformity of the polishing rate was controlled at 0.07, no scratches on the surface, and the roughness was 0.5 nm.

Selections of the FA/OII chelating agent, the active agent, and the oxidant were same as those of Example 1.

Example 3

Preparation of a polishing solution and conditions for polishing copper wiring using a low pressure CMP method are as follows:

Preparation of 3210 g of a copper wiring polishing solution: 1500 g of a nano silica sol (30-40 nm) with a concentration of between 4 and 50 w. % was stirred with 1500 g of deionized water added to yield a mixture, and thereafter, the stirring was continued with 90 g of a FA/OII chelating agent, 30 g of a FA/0 surfactant, and 90 g of an oxidant added to the mixture. The pH value of the mixture was adjusted to between 9 and 13, and the resulting solution was stirred evenly to yield 3210 g of the copper wiring polishing solution.

Polishing was processed under following conditions: 2 kPa of a pressure, 250 mL/min of a flow rate, and 60 rpm/min of a rotational speed at 20° C. for 10 min.

Polishing rate was 1174 nm/min, ununiformity of the polishing rate was controlled at 0.03, no scratches on the surface, and the roughness was 0.2 nm.

Selections of the FA/OII chelating agent, the active agent, and the oxidant were same as those of Example 1.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A method of polishing surfaces of copper wiring of an ultra large scale integrated circuit, the method comprising:
   a) preparing a polishing solution consisting essentially of: between 35 and 80 w. % of a nano $SiO_2$ abrasive, between 12 and 60 w. % of deionized water, between 1 and 3 w. % of an oxidant, between 1 and 4 w. % of an active agent, and between 0.5 and 1.5 w. % of a chelating agent; and
   b) polishing using the polishing solution under following conditions:
      pressure: between 2 and 5 kPa;
      temperature: between 20 and 50° C.;
      flow rate: between 120 and 250 mL/min; and
      rotational speed: between 30 and 60 rpm/min;
   wherein the active agent is selected from the group consisting of an FA/O surfactant, $O_\pi\text{-}7((C_{10}H_{21}\text{---}C_6H_4\text{---}O\text{---}CH_2CH_2O)_7\text{---}H)$, $O_\pi\text{-}10((C_{10}\text{---}H_{21}\text{---}C_6H_4\text{---}O\text{---}CH_2CH_2O)_{10}\text{---}H)$, $O\text{-}20(C_{12\text{-}18}H_{25\text{-}37}\text{---}C_6H_4\text{---}O\text{---}CH_2CH_2O)_{70}\text{---}H)$, or JFC.

2. The method of claim 1, wherein the nano $SiO_2$ abrasive is an alkaline water-soluble silica sol having a concentration of between 4 and 50 w. %, a particle size of between 15 and 40 nm, and a pH value of between 9 and 13.

3. The method of claim 1, wherein the chelating agent is an FA/OII chelating agent: ethylene diamine tetra-acetic acid tetra (tetra-hydroxyethyl ethylene diamine).

4. The method of claim 1, wherein the oxidant is a soluble oxidant under alkaline conditions and selected from the group consisting of $H_2O_2$, $KClO_3$, $KMnO_4$, or $KNO_3$.

5. The method of claim 3, wherein A method of polishing surfaces of copper wiring of an ultra large scale integrated circuit, the method comprising:
   a) preparing a polishing solution consisting essentially of: between 35 and 80 w. % of a nano $SiO_2$ abrasive, between 12 and 60 w. % of deionized water, between 1 and 3 w. % of an oxidant, between 1 and 4 w. % of an active agent, and between 0.5 and 1.5 w. % of a chelating agent; and
   b) polishing using the polishing solution under following conditions:
      pressure: between 2 and 5 kPa;
      temperature: between 20 and 50° C.;
      flow rate: between 120 and 250 mL/min; and
      rotational speed: between 30 and 60 rpm/min;
   wherein:
      the chelating agent is an FA/OII chelating agent: ethylene diamine tetra-acetic acid tetra (tetra-hydroxyethyl ethylene diamine); and
      the structural formula of ethylene diamine tetra-acetic acid tetra (tetra-hydroxyethyl ethylene diamine) is:

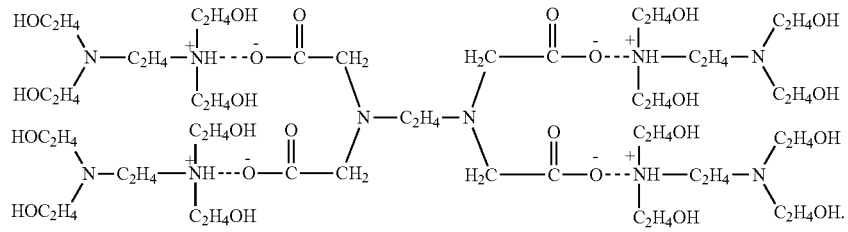

6. A method of polishing surfaces of copper wiring of an ultra large scale integrated circuit, the method comprising:
   a) preparing a polishing solution consisting essentially of: between 35 and 80 w. % of a nano $SiO_2$ abrasive, between 12 and 60 w. % of deionized water, between 1 and 3 w. % of an oxidant, between 1 and 4 w. % of an active agent, and between 0.5 and 1.5 w. % of a chelating agent; and
   b) polishing using the polishing solution under following conditions:
      pressure: between 2 and 5 kPa;
      temperature: between 20 and 50° C.;
      flow rate: between 120 and 250 mL/min; and
      rotational speed: between 30 and 60 rpm/min;
   wherein:
      the chelating agent is ethylene diamine tetra-acetic acid tetra (tetra-hydroxyethyl ethylene diamine.

7. The method of claim 6, wherein the structural formula of ethylene diamine tetra-acetic acid tetra (tetra-hydroxyethyl ethylene diamine) is:

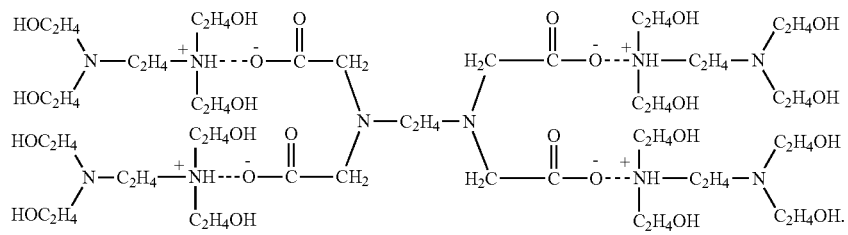

* * * * *